(12) United States Patent
Villarreal et al.

(10) Patent No.: US 9,619,601 B1
(45) Date of Patent: Apr. 11, 2017

(54) CONTROL AND DATA FLOW GRAPH GENERATION FOR HARDWARE DESCRIPTION LANGUAGES

(71) Applicant: Xilinx, Inc., San Jose, CA (US)

(72) Inventors: Jason Villarreal, Los Gatos, CA (US); Valeria Mihalache, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 77 days.

(21) Appl. No.: 14/603,259

(22) Filed: Jan. 22, 2015

(51) Int. Cl.
G06F 17/50 (2006.01)
G06F 9/44 (2006.01)

(52) U.S. Cl.
CPC ...... *G06F 17/5045* (2013.01); *G06F 17/5022* (2013.01); *G06F 8/30* (2013.01); *G06F 8/35* (2013.01); *G06F 17/5009* (2013.01)

(58) Field of Classification Search
CPC .... G06F 17/5009; G06F 8/35; G06F 17/5022; G06F 8/30
USPC ................. 716/100, 103–104, 136; 717/106, 717/155–156, 159–160
See application file for complete search history.

(56) References Cited

U.S. PATENT DOCUMENTS

| | | | |
|---|---|---|---|
| RE40,925 E * | 9/2009 | Ly | G06F 8/4452 716/103 |
| 8,694,947 B1 * | 4/2014 | Venkataramani | G06F 17/5045 716/113 |
| 8,863,069 B1 * | 10/2014 | Venkataramani | G06F 17/5045 716/100 |
| 2002/0188923 A1 * | 12/2002 | Ohnishi | G06F 17/5045 716/104 |
| 2003/0188299 A1 * | 10/2003 | Broughton | G06F 8/427 717/141 |
| 2013/0198713 A1 * | 8/2013 | Zhang | G06F 8/10 717/106 |

* cited by examiner

*Primary Examiner* — Stacy Whitmore
(74) *Attorney, Agent, or Firm* — Keith Taboada; Robert M. Brush (57) ABSTRACT

An example method of generating a control and data flow graph for hardware description language (HDL) code specifying a circuit design is described. The method includes traversing an abstract syntax tree (AST) representation of the HDL code having a plurality of modules on a module-by-module basis. The method further includes adding an execution unit to the control and data flow graph for each module having concurrent paths. Each execution unit includes nodes in the control and data flow graph. The nodes include a loopback sink that merges the concurrent paths and a loopback source that receives feedback from the loopback sink and propagates the feedback to the concurrent paths.

20 Claims, 9 Drawing Sheets

CONTROL AND DATA FLOW GRAPH GENERATION FOR HARDWARE DESCRIPTION LANGUAGES

TECHNICAL FIELD

Examples of the present disclosure generally relate to electronic circuit design and, in particular, to a control and data flow graph generation for hardware description languages.

BACKGROUND

A necessary component that enables compiler optimizations is a representation of control flow and data flow, typically contained in a Control Flow Graph and a Data Flow Graph (CDFG). For sequential programming languages, such as C or C++, the construction of a CDFG is well understood. For concurrent languages, such as a hardware description language (HDL), a traditional CDFG cannot adequately represent all the semantics of the language, such as the representation of statements executing concurrently, the notion of time, or hierarchical references. HDLs are frequently used to specify circuit designs for an integrated circuit (IC), such as a field programmable gate array (FPGA), application specific integrated circuit (ASIC), or the like. An electronic design automation (EDA) tool compiles HDL code specifying a circuit design for implementation in a target IC.

Example HDLs include Verilog, SystemVerilog, and VHDL. In such HDLs, control flow can be broken with delays or event triggers. Unlike sequential languages, a sequential block of instructions in HDL code may not actually execute consecutively. Some statements inside a sequential block cannot proceed without detecting an event, and the subsequent execution of the sequential block can be altered by other instructions executing simultaneously. In HDLs, the presence of hierarchical references breaks the locality of data flow. Therefore, controlling of dataflow are not efficiently modeled in HDL designs.

SUMMARY

Techniques for generating a control and data flow graph (CDFG) for hardware description languages (HDLs) are described. In an example, a method of generating a control and data flow graph for hardware description language (HDL) code specifying a circuit design includes: traversing an abstract syntax tree (AST) representation of the HDL code having a plurality of modules on a module-by-module basis; and adding an execution unit to the control and data flow graph for each module having concurrent paths, each execution unit comprising nodes in the control and data flow graph, the nodes including a loopback sink that merges the concurrent paths and a loopback source that receives feedback from the loopback sink and propagates the feedback to the concurrent paths.

In another example, a system comprises a memory for storing program code and an abstract syntax tree (AST) representation of hardware description language (HDL) code having a plurality of modules. The system further comprises a processor, coupled to the memory, configured to execute the program code to: traverse the AST on a module-by-module basis; and add an execution unit to the control and data flow graph for each module having concurrent paths, each execution unit comprising nodes in the control and data flow graph, the nodes including a loopback sink that merges the concurrent paths and a loopback source that receives feedback from the loopback sink and propagates the feedback to the concurrent paths.

In another example, a non-transitory computer readable medium having instructions stored thereon that when executed by a processor cause the processor to perform a method of generating a control and data flow graph for hardware description language (HDL) code specifying a circuit design includes: traversing an abstract syntax tree (AST) representation of the HDL code having a plurality of modules on a module-by-module basis; and adding an execution unit to the control and data flow graph for each module having concurrent paths, each execution unit comprising nodes in the control and data flow graph, the nodes including a loopback sink that merges the concurrent paths and a loopback source that receives feedback from the loopback sink and propagates the feedback to the concurrent paths.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Techniques for generating a control and data flow graph (CDFG) for hardware description languages (HDLs) are described (referred to as an "HDL-CDFG"). A structure for an HDL-CDFG is provided that can be used during compilation of HDL code and encapsulates the semantics of the language. Previous approaches in building graph representations for HDL designs are based on abstract syntax tree (AST) models. The complexities of modeling concurrency, time, and hierarchical references in AST-based representations are handled through annotations and additional data structures adjacent to the AST. Moreover, ASTs do not explicitly encode control and data flow in HDL designs. The HDL-CDFG described herein can be constructed from a traversal of an AST. Once constructed, both well-defined compiler optimizations and HDL-specific optimizations can be applied, and correct results can be generated, without knowledge of the intricacies of the underlying HDL language. The HDL-CDFG representation described herein is applicable to various HDLs, such as Verilog, SystemVerilog, VHDL, and the like.

The techniques for building the HDL-CDFG described herein differ from traditional compiler CDFG methods used for sequential languages, such as C. In traditional compilers, control data flow graphs undergo additional transformations into a Static Single Assignment (SSA) representation of a program before being used for optimizations. The SSA representation leads to phi functions and must be transformed back, incurring additional cost. The techniques for generating an HDL-CDFG described herein do not require an SSA-like representation of the HDL design.

In both procedural languages and concurrent languages, data flow follows control flow. The semantics of HDLs add several issues that must be incorporated into the CDFG, such as the concept of delayed assignments, where data does not flow while executing a statement, but instead is scheduled to be updated at a later time. While many of the language semantics of HDLs and other concurrent languages are dynamic in nature and cannot be completely captured in a static analysis representation, the HDL-CDFG described herein captures many of the dynamic situations in a statically generated structure and opens up these languages to the standard set of optimizations performed on traditional CDFGs, as well as to additional optimizations that benefit HDLs. While various aspects are described with respect to compiling HDL code, the techniques described herein are equally applicable to build CDFGs for other programming languages having concurrent or time-based semantics. These and further aspects of the present disclosure are discussed below.

Figure 1:
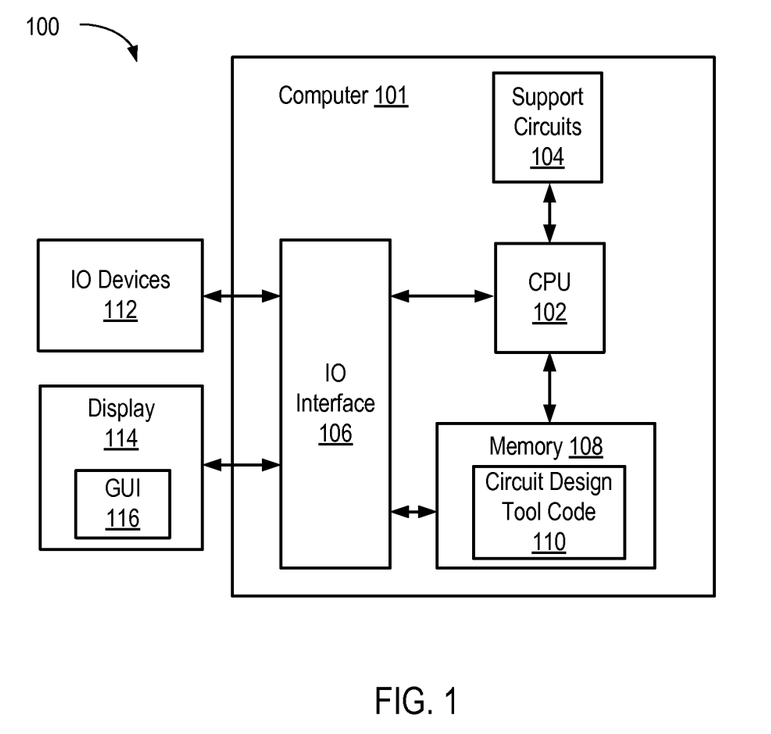
FIG. 1 is a block diagram depicting an example of a circuit design system.

FIG. 1 is a block diagram depicting an example of a circuit design system 100. The circuit design system 100 includes a computer 101 coupled to input/output (IO) devices 112, and a display 114. The computer 101 includes a central processing unit (CPU) 102, a memory 108, various support circuits 104, and an IO interface 106. The CPU 102 can include one or more microprocessors. The support circuits 104 can include conventional cache, power supplies, clock circuits, data registers, IO interfaces, and the like. The IO interface 106 can be directly coupled to the memory 108 or coupled through the CPU 102. The IO interface 106 can be coupled to the IO devices 112, which can include conventional keyboard, mouse, and the like. The IO interface 106 can also be coupled to the display 114, which can present a GUI 116 to a user.

The memory 108 may store all or portions of one or more programs and/or data to implement aspects of the circuit design system 100 described herein. For example, the memory 108 can store circuit design tool code 110 that is executable by the CPU 102 to implement a circuit design tool, which is described below. The memory 108 can include one or more of random access memory (RAM), read only memory (ROM), magnetic read/write memory, FLASH memory, solid state memory, or the like as well as combinations thereof.

Figure 2:
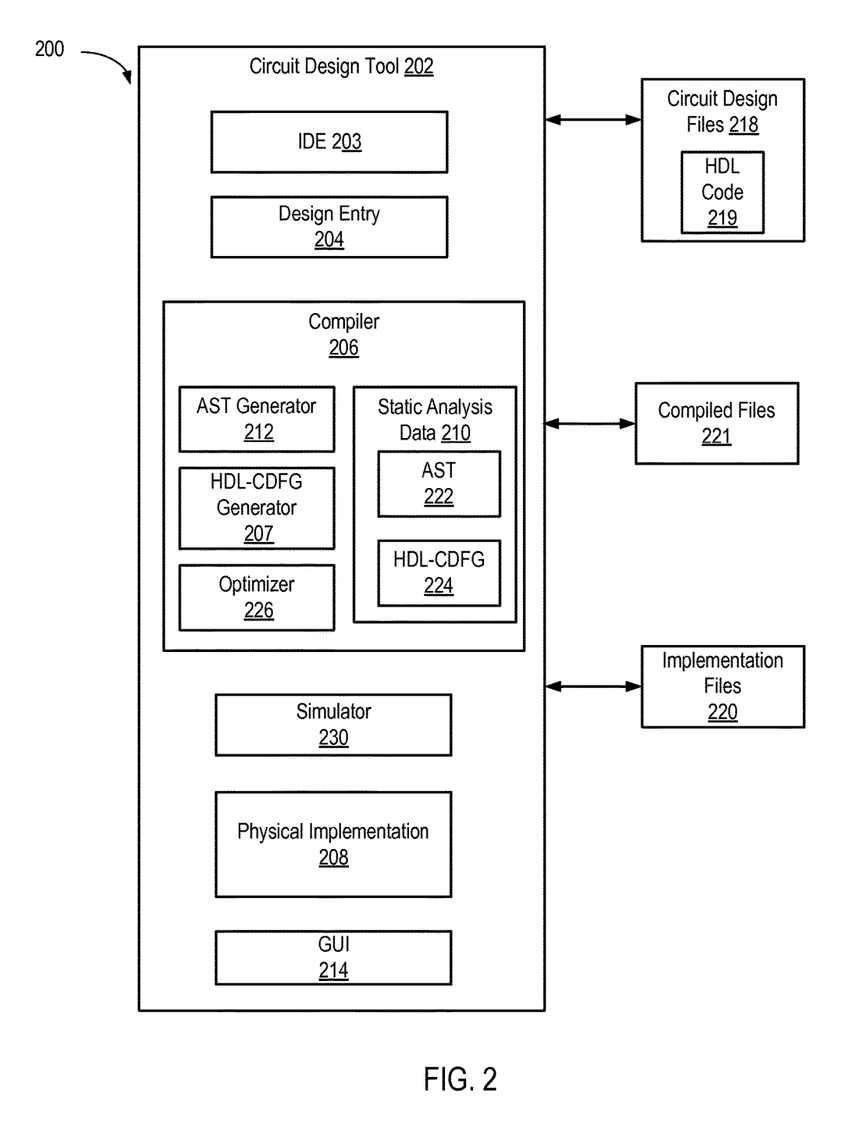
FIG. 2 is a block diagram shown a logical view of the circuit design system of FIG. 1.

FIG. 2 is a block diagram shown a logical view 200 of the circuit design system 100 of FIG. 1. The circuit design system 100 includes a circuit design tool 202 having an integrated development environment (IDE) module 203, a design entry module 204, a compiler 206, a simulator 230, a physical implementation module 208, and a graphical user interface (GUI) module 214. The modules 203, 204, 206, 230, 208, and 214 are just one example implementation of the circuit design tool 202. The functions performed by the modules 203, 204, 206, 230, 208, and 214 described herein can be performed by a different configuration of one or more modules in the circuit design tool 202. The circuit design tool 202 can be implemented by circuitry that is part of an electronic system, by firmware in the electronic system, by software in the electronic system, or by a combination thereof. An example electronic system in which the circuit design system 100 can be implemented is described above in FIG. 1.

In general, the circuit design system 100 generates an abstract description of the circuit design, which is processed into a physical description of the circuit design for implementation in a target IC ("target hardware"). The circuit design system 100 can process the abstract description of the circuit design through various intermediate transformations to produce the physical description of the circuit design. For a programmable IC (e.g., a field programmable gate array (FPGA)), a physical description of a circuit design portion can be formatted and loaded into the programmable IC to produce a physical circuit. For a masked-programmable IC (e.g., an application specific integrated circuit (ASIC)), a physical description of a circuit design portion can be formatted to generate a mask set. Thus, the circuit design system 100 transforms an abstract representation of the circuit design (the abstract description) into a physical representation of the circuit design (the physical description) that can be formatted to realize physical circuits in the target hardware.

A user can interact with the circuit design tool 202 to produce circuit design files 218. The circuit design files 218 include one or more files specifying the circuit design at various levels of abstraction, such as a high-level block model of the circuit design, a lower level hardware description language (HDL) model of the circuit design, or the like. In an example, the circuit design files 218 include HDL code 219 specifying a circuit design (HDL design). In general, the circuit design files 218 have little or no dependence on the target hardware. The circuit design tool 202 processes the circuit design files 218 to generate the implementation files 220. The implementation files 220 include one or more files specifying the circuit design with varying dependence of the target hardware. For example, the implementation files 220 can include synthesized netlists, mapped, placed, and routed netlists, configuration bitstreams, mask files, and the like.

The IDE module 203 provides a user interface through the GUI 214 to assemble, implement, and validate a circuit design for the target hardware. The IDE module 203 controls the overall circuit design process, including invocation of the design entry module 204, the compiler 206, and the physical implementation module 208.

The design entry module 204 generates a functional description of the circuit design in response to user input through the GUI 214. The functional description can include descriptions for a plurality of circuit components, such as flip-flops, memories, logic gates, processors, and the like, coupled together by connections (referred to as "nets" or "signals"). The GUI 214 can include a graphic interface through which an end user connects symbols and blocks representing various components to produce a schematic of the circuit design, which is converted into HDL code 219. The GUI 214 can include a text interface through which a user writes HDL code 219 directly. The GUI 214 can employ a combination of schematic and text-based entry.

The compiler 206 compiles the HDL code 219 to produce a representation of the circuit design that can be executed by the simulator 230 (compiled files 221). The compiler 206 can include an optimizer 226 that performs optimizations during compilation of the HDL code 219, allowing for more efficient simulation. In particular, the compiler 206 can include an abstract syntax tree (AST) generator 212 and an HDL control flow and data flow graph (HDL-CDFG) generator 207, each of which generate static analysis data 210. The AST generator 212 performs a static analysis of the HDL code 219 to generate an AST 222. The AST 222 is a tree representation of syntactic structure of the HDL code 219. The HDL-CDFG generator 207 processes the AST 222 to generate an HDL-CDFG 224. First, the HDL-CDFG generator 207 performs a control flow analysis using the AST 222 as input to generate a control flow graph (CFG). Then, the HDL-CDFG generator 207 performs a data flow analysis on the CFG, including the generation of use-definition (use-def) and definition-use (def-use) chains. During both the control flow analysis and the data flow analysis, the HDL-CDFG generator 207 adapts to concurrency in the HDL code 219, which allows the optimizer 226 to perform both traditional and HDL-specific optimizations without having knowledge of the intricacies of the underlying HDL language. The simulator 230 can execute the compiled files 221 to simulate the circuit design.

The physical implementation module 208 produces a physical implementation of the circuit design from the circuit design files 218. Physical implementation can be performed after simulation to ensure correct operation of the circuit design. The physical implementation of the circuit design is a physical representation of the circuit design for implementation in the target hardware. The physical implementation can be stored in one or more of the implementation files 220.

Figure 3:
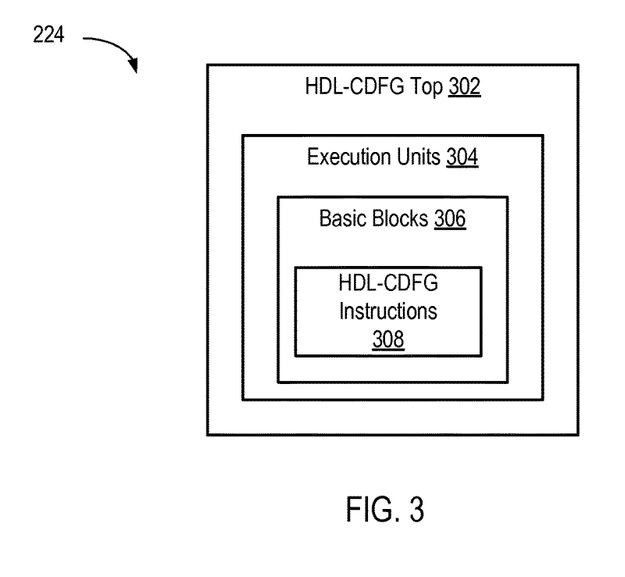
FIG. 3 is a block diagram depicting an example representation of an HDL-CDFG.

FIG. 3 is a block diagram depicting an example representation of the HDL-CDFG 224. At the lowest level, the HDL-CDFG 224 abstracts HDL statements in the HDL code 219 into HDL-CDFG instructions 308. An HDL-CDFG instruction 308 holds information about which variables are read and written in that instruction, as well as data flow information, such as which definitions reach to that point in the HDL code 219. The HDL-CDFG instructions 308 can be used by the optimizer 226 without any knowledge of the underlying HDL language.

HDL-CDFG instructions 308 are collected into basic blocks 306. That is, each basic block 306 generally includes one or more HDL-CDFG instructions 308. A basic block 306 represents a sequential set of instructions that are executed without any break in-between. The basic blocks 306 are the nodes of the control flow portion of the HDL-CDFG 224 and model the different execution paths that could occur during circuit operation.

The basic blocks 306 are collected into execution units 304. That is, each execution unit 304 generally includes one or more basic blocks 306. An execution unit 304 models all code of an HDL function, task, or module. Each execution unit 304 contains all of the information regarding the variables declared in the scope of such HDL function, task, or module. Within an execution unit 304, all collected data flow information is local to that execution unit 304. An execution unit 304 does not track variables that lie outside its scope.

The execution units 304 are collected into an HDL-CDFG top 302. The HDL-CDFG top 302 is responsible for resolving any out-of-scope accesses that occur within the execution units 304. The HDL-CDFG top 302 includes all of the execution units 304, which the optimizer 226 can iterate over to perform optimizations.

Figure 4:
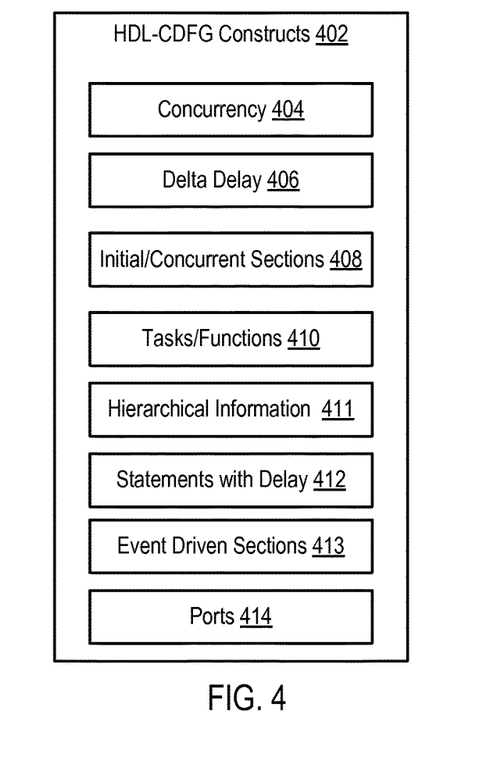
FIG. 4 is a block diagram depicting types of HDL-CDFG constructs that can be generated for an HDL-CDFG given HDL code.

FIG. 4 is a block diagram depicting types of HDL-CDFG constructs 402 that can be generated for the HDL-CDFG 224 given the HDL code 219. The different constructs model different aspects of the underlying HDL language. In particular, the HDL-CDFG 224 can include concurrency constructs 404 that model concurrency in the HDL code 219. Concurrent languages, such as HDLs, allow for the specification of statements or blocks of statements that occur simultaneously. The definitions of variables in one concurrent section will be accessible to other concurrent sections. A traditional control/data flow graph does not have the capacity to model this type of behavior. The HDL-CDFG 224 models concurrent sections as shown in FIG. 5.

Figure 5:
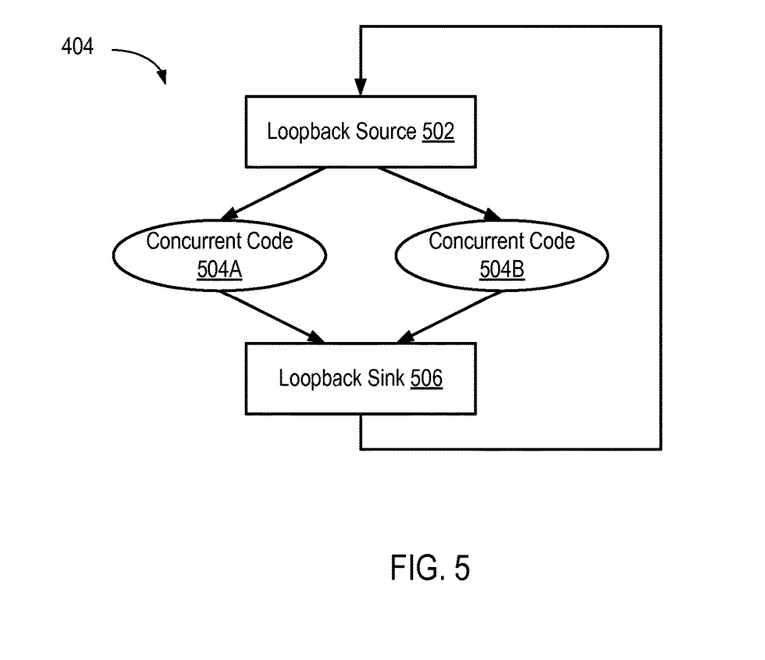
FIG. 5 is a block diagram that illustrates an example concurrency construct.

FIG. 5 is a block diagram that illustrates an example concurrency construct 404. As shown, rectangles represent singular basic blocks, while ovals represent collections of basic blocks that represent arbitrary control flow. The concurrency construct 404 includes a loopback source 502, concurrent code 504A, concurrent code 504B, and a loopback sink 506. Each module in the HDL code 219 that has concurrent elements results in addition of a concurrency construct 404 to the HDL-CDFG 224. The loopback source 502 and the loopback sink 504 are constructed in a way to allow data to flow from one concurrent section to another, while appearing as normal basic blocks once constructed and traversed. The loopback source 502 and the loopback sink 504 are basic blocks that introduce instructions into the graph that have no corresponding instruction in the original HDL code 219, but rather model a concept of the underling HDL language. These "constructed instructions" allow the HDL-CDFG 224 to model the concurrent behavior of the HDL code 219, while providing the benefit of allowing for standard compiler optimization traversals. Further, the concurrency construct 404 does not require any annotation of the AST 222 or any changes to the original HDL code 219.

The HDL-CDFG 224 is constructed on a module-by-module basis. Accordingly, each execution unit that has concurrent statements requires its own loopback source and loopback sink basic blocks. Each concurrent path in the HDL-CDFG 224 models the control and data flow for the corresponding portion of the HDL code 219. In order to model the control and data flow that occurs due to concurrent execution, all data information flows out of each concurrent section (e.g., concurrent code 504A and concurrent code 504B) and is merged in the loopback sink 506. The loopback sink 506 feeds information back to the loopback source 502, which in turn propagates the information downward into all concurrent sections (modeling these connections that were only implicit in the HDL code 219). While two concurrent code sections 504A and 504B are shown in the example, the concurrency construct 404 can include more than two concurrent code sections.

Returning to FIG. 4, the HDL-CDFG 224 can include delta delay constructs 406. In HDLs, signal assignment statements may have the semantics of scheduling the assignment to occur at some point in the future. Such signal assignment statements cannot be modeled in the same manner as instantaneous assignments. Even the presence of the smallest delay, referred to as the delta delay, data dependencies that would be constructed in a data flow graph for sequential languages would be incorrect.

Figure 6:
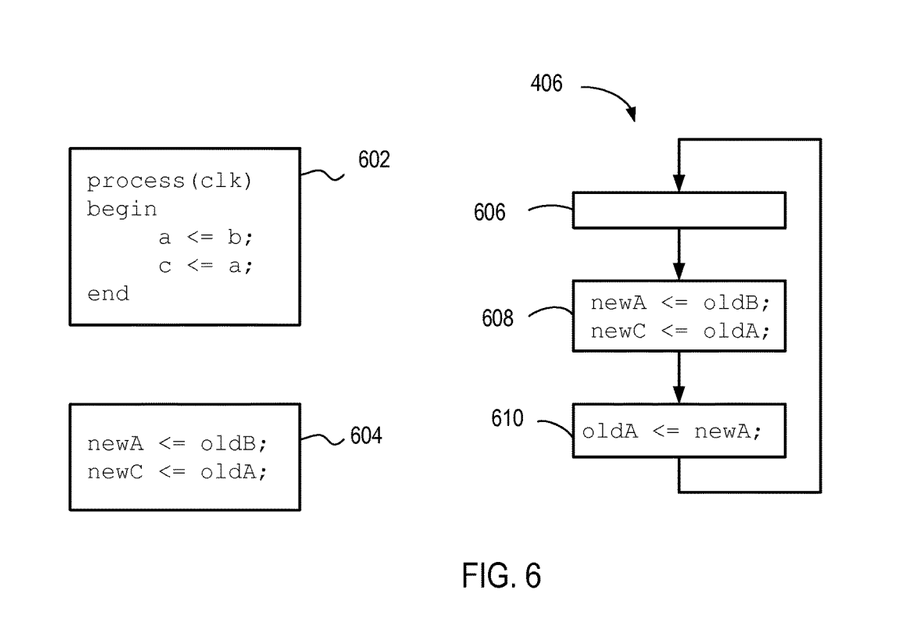
FIG. 6 shows example HDL code and a resulting delta delay construct.

For example, FIG. 6 shows example HDL code and a resulting delta delay construct 406. Block 602 includes an example VHDL process that would have a dependency between the first and second comparison statements (e.g., a<=b and c<=a) due to the variable 'a' if VHDL was a sequential language, but no such dependency exists due to the semantics of VHDL. In VHDL, individual slices or bits of a bus are not distinguished and any read or write to a subsection of a bus acts as a read or write to the entire bus.

In order to accurately model the delta delay concept, a set of dual variables is introduced for every HDL variable that is assigned using a non-blocking assignment. One variable in the set represents the old value of the HDL variable, and the other variable in the set represents the new value of the HDL variable. Then, all instances of the HDL variable on the left had side of non-blocking assignments are replaced with the "new" version of the variable, and all instances of the HDL variable on the right-hand side of non-blocking assignments are replaced with the "old" version of the variable. This is illustrated in block 604 for the example VHDL code in block 602. As shown in block 604, "newA<=oldB" and "newC<=oldA" given "a<=b" and "c<=a" in the VHDL code of block 602.

If a blocking assignment to an HDL variable is encountered, the "old" version of the HDL variable is used on both the right- and left-hand sides of the blocking assignment, as the blocking assignment can happen without delay. For purposes of optimizations and traversals, the "old" version and the "new" version of the HDL variable can be treated as two separate variables despite referring to the same concrete variable.

Additionally, an instruction is created in the loopback source/sink to have data flow from the "new" value of each variable to the "old" value of each variable in order to model the data flowing between time steps, as shown in delta delay construct 406 for the example VHDL code in block 602. In the delta delay construct 406, a loopback source 606 feeds information to concurrent code section 608, which feeds information to loopback sink 610, which feeds information back to the loopback source 606. The concurrent code section 608 includes the modified assignments as shown in block 604. The loopback sink 610 includes an additional instruction "oldA<=newA" to have data flow from the "new" value to the "old" value of the variable 'a'. The additional instruction has no equivalent in the original HDL code 219 and may be safely eliminated in subsequent compilation.

Returning to FIG. 4, the HDL-CDFG 224 can include initial/concurrent sections constructs 408. In addition to describing concurrent and continuous events, HDLs also provide a mechanism for describing processes that occur once at time zero and then are never repeated. The definitions for such initialization statements will affect every statement that occurs concurrently after time zero, but should not reach other statements that also occur at time zero. In order to model such behavior, two nodes are added to the concurrency construct 404, as shown in FIG. 7.

Figure 7:
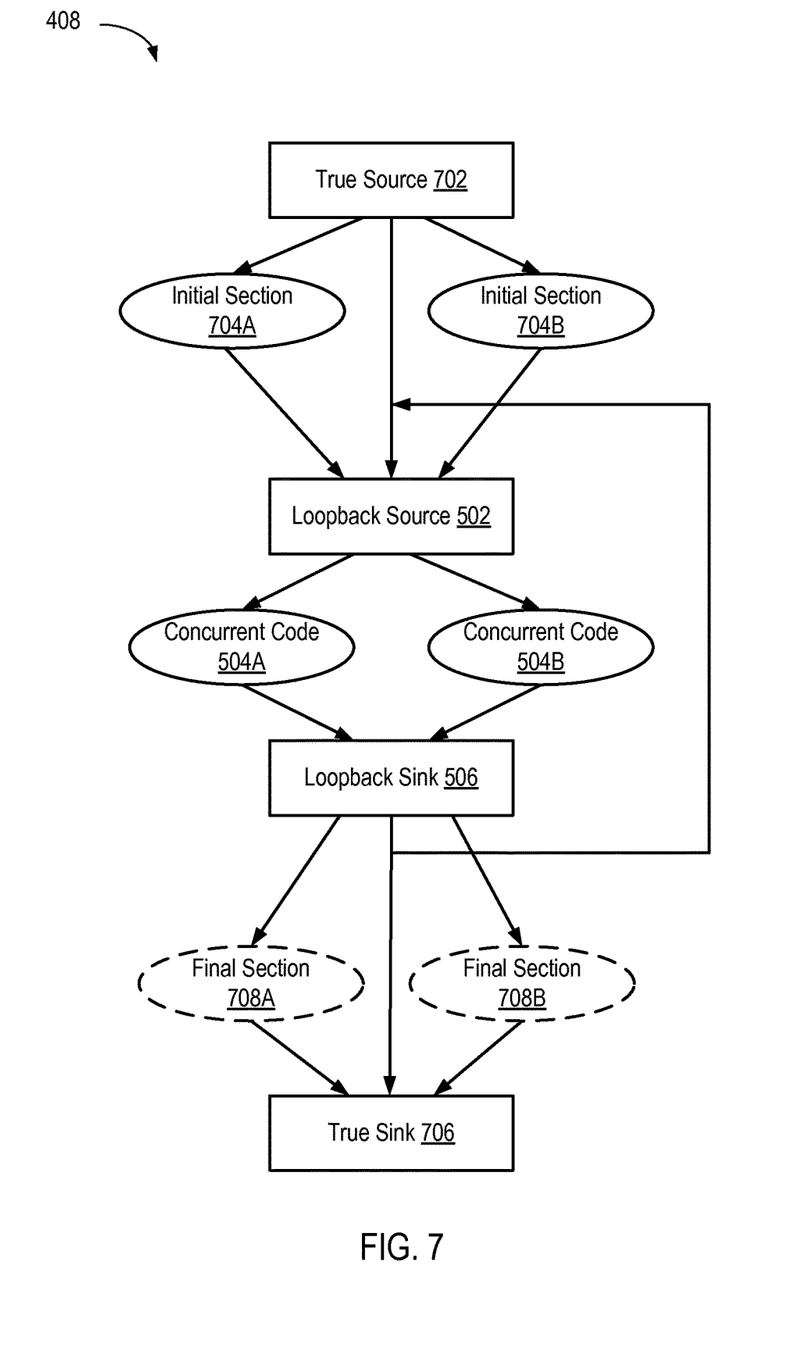
FIG. 7 is a block diagram that illustrates an example concurrency construct that includes initial and concurrent sections.

FIG. 7 is a block diagram that illustrates an example concurrency construct 408 that includes initial and concurrent sections. Elements of the concurrency construct 408 that are the same or similar to the concurrency construct 404 are designated with identical reference numerals and described above with respect to FIG. 5. As shown, rectangles represent singular basic blocks, while ovals represent collections of basic blocks that represent arbitrary control flow. The two additional nodes (basic blocks) are the true source 702 and the true sink 706, which represent the inputs and outputs of an HDL module respectively and are the absolute beginning and ending of control and data flow. Thus, the concurrency construct 408 includes two section groups, i.e., the initial section group (e.g., initial sections 704A and 704B) and the concurrent section group (e.g., the concurrent code sections 504A and 504B). The basic blocks between the true source 702 and the loopback source 502 (e.g., the initial sections 704A and 704B) contain code that is executed at time zero. While two initial sections 704A and 704B are shown, the concurrency construct 408 can include more than two initial sections. The basic blocks between the loopback source 502 and the loopback sink 506 (e.g., the concurrent code sections 504A and 504B) contain the concurrent code, as described above.

In an example, the concurrency construct 408 can include another section group, i.e., the final section group (e.g., final sections 708A and 708B). The final sections are disposed between the loopback sink 506 and the true sink 706 and can model such constructs as the SystemVerilog final blocks, which are executed only once at the end of simulation.

Returning to FIG. 4, the HDL-CDFG 224 can include task/function constructs 410. Functions in HDLs have the semantics of executing instantaneously with no delays and, as such, can be modeled without a concurrent section and only one initial path. Tasks in HDLs may have delays, but tasks have completely contained control flow (e.g., no other concurrent statements with the exception of hierarchical information described below that may affect anything outside of the task). To model tasks, a concurrent section can be omitted and only one initial path provided. In addition, basic blocks are inserted at each delay point to model the delay. These basic blocks are responsible for updating dual signals, as described above with respect to the delta delay construct 406.

Figure 8:
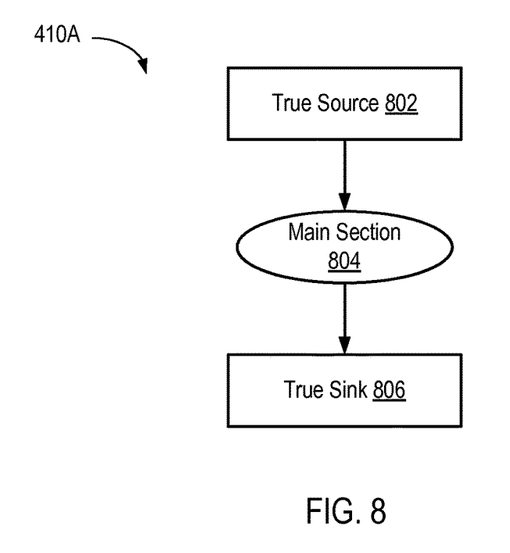
FIG. 8 is a block diagram that illustrates an example construct for modeling an HDL function.
Figure 9:
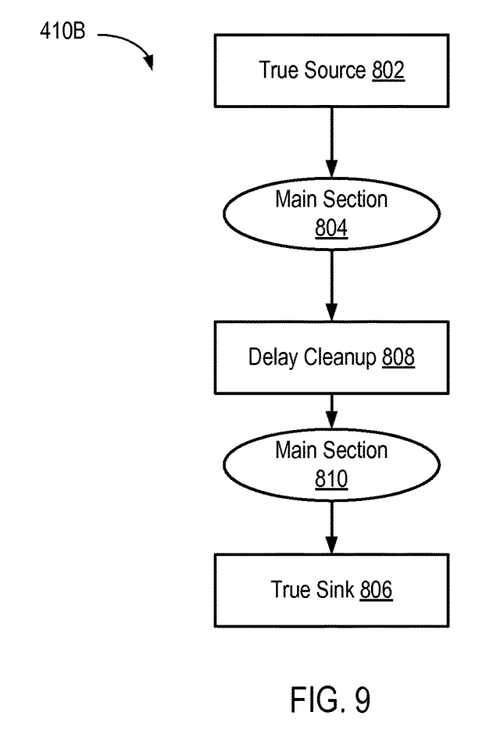
FIG. 9 is a block diagram that illustrates an example construct for modeling an HDL task.

FIG. 8 is a block diagram that illustrates an example construct 410A for modeling an HDL function. FIG. 9 is a block diagram that illustrates an example construct 410B for modeling an HDL task. As shown, rectangles represent singular basic blocks, while ovals represent collections of basic blocks that represent arbitrary control flow. As shown in FIG. 8, a true source 802 feeds a main section 804, which in turn feeds a true sink 806. Thus, the construct 410A for modeling a function includes only one path through the main section 804. As shown in FIG. 9, a basic block is inserted to model a delay point in an HDL task (delay cleanup 808). The main section 804 feeds the delay cleanup 808, which feeds a main section 810, which in turn feeds the true sink 806. Thus, the construct 410B for modeling a task includes only one path through the main sections 804 and 810, but also includes a delay cleanup 808 to model a delay point in the task.

Returning to FIG. 4, the HDL-CDFG 224 can include constructs 411 to model hierarchical information. HDLs, such as Verilog, allow for the direct reading and writing of variables in other scopes through the use of hierarchical references. Additionally, functions and tasks may use variables declared in an encompassing scope and will affect other execution units when written to. Each variable that is accessed out of scope inside an execution unit is recorded and that information is propagated to all execution units that call or instantiate that execution unit. With this information, a bucket for the hierarchically referenced variables is created for each module. The accesses to hierarchically referenced variables are not added to the data flow information, keeping the size of the data set for each execution unit as small as possible. A compile-time optimization that can be applied using the constructs 411 is the propagation of use information. Instantiations of modules or calls to functions that access variables in the caller's scope are added to the data flow information of the caller.

The HDL-CDFG 224 can include constructs 412 to model statements with delay. A unique aspect of HDLs is the presence of statements with explicit delay, such as wait statements. Statements that contain delays break the control and data flow and need special handling in the HDL-CDFG 224. The context of the statement, whether encountered in an initial block, VHDL process, initialization code, or a concurrent statement, determines the action taken when constructing the HDL-CDFG 224. When building the HDL-CDFG 224 for control structures such as loops and if statements, the constructs must be preprocessed to determine if they contain any delay statements. Control structures that do contain a delay require the construction of a new concurrent section and the entire structure must be modeled in that concurrent section.

The HDL-CDFG 224 can include constructs 413 to model event driven sections. In HDLs, concurrent code may be guarded with an event and that code should be executed every time the event is true. Examples of this type of construct include the VHDL process and the Verilog "always" block. When constructing the HDL-CDFG 224, a control/data flow path must be modeled for when the event has occurred, and another control/data flow path must be constructed for when the event did not occur.

Figure 10:
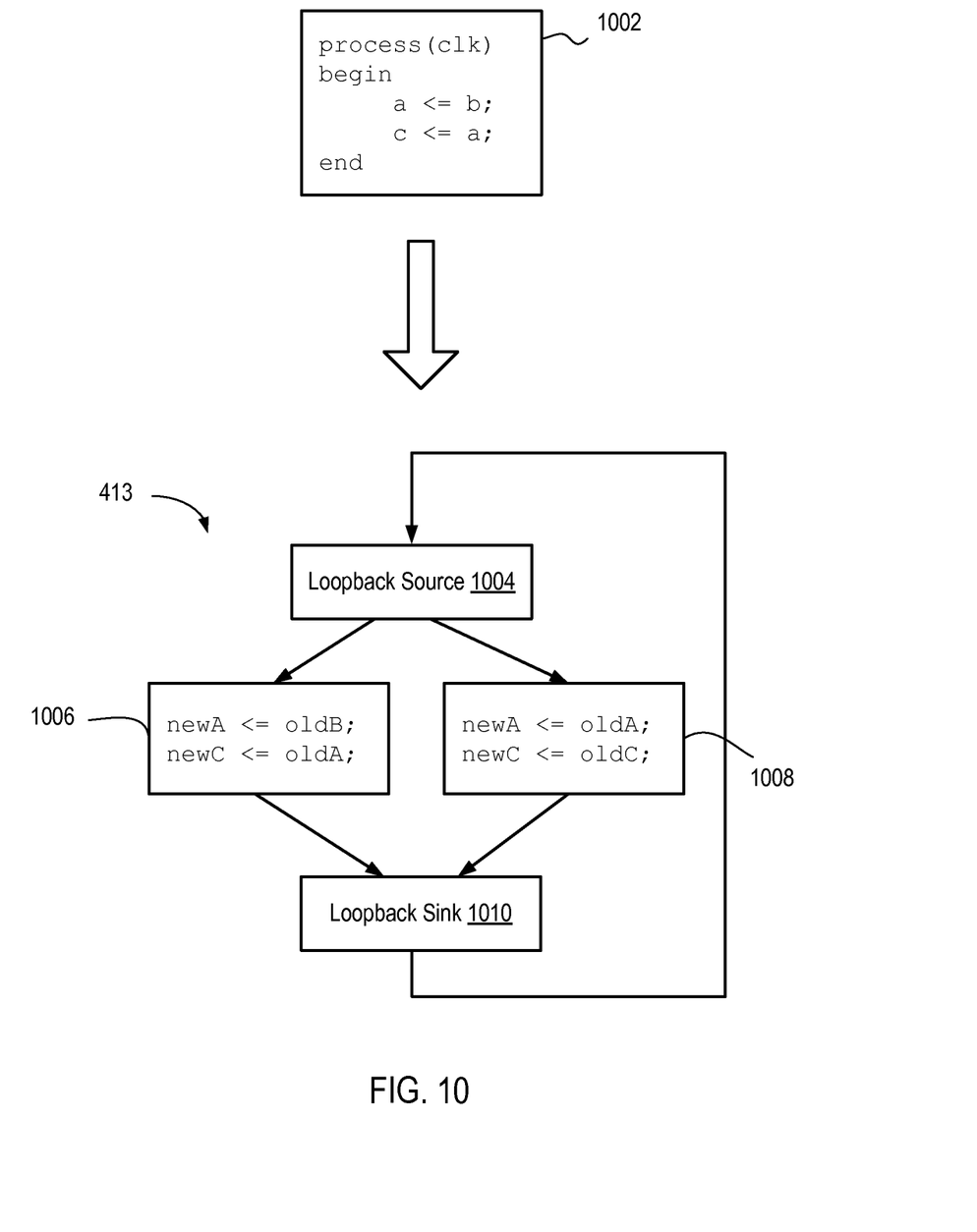
FIG. 10 shows example HDL code and a resulting event driven construct.

FIG. 10 shows example HDL code and a resulting event driven construct 413. A block 1002 shows an example VHDL process having comparison statements "a<=b" and "c<=a". The event driven construct 413 includes a loopback source 1004 that feeds two sections 1006 and 1008, which in turn feeds a loopback sink 1010. The loopback sink 1010 feeds information back to the loopback source 1004. The section 1006 represents the "taken path", and the section 1008 represents the "not-taken path". In the not-taken path section 1008, every variable that is defined in the taken path section 1006 is given a fake definition to hold its old value. The basic block for the not-taken path section 1008 and the included instructions have no equivalent in the original HDL code 219 and may be safely ignored after optimizations have been performed.

Returning to FIG. 4, the HDL-CDFG 224 can include constructs 414 to model ports. The ports to a hardware module or the parameters to a task are both modeled as normal signals in the HDL-CDFG 224. However, an additional instruction is added to both the true source and the true sink to handle the data flow of ports. All ports that are input are marked as being read in the true source, and all output ports are marked as being read in the true sink. Ports that are both input and output are marked in both locations. These added instructions have no equivalent in the HDL code 219 and may be safely removed or ignored in subsequent compilation steps after optimization.

Figure 11:
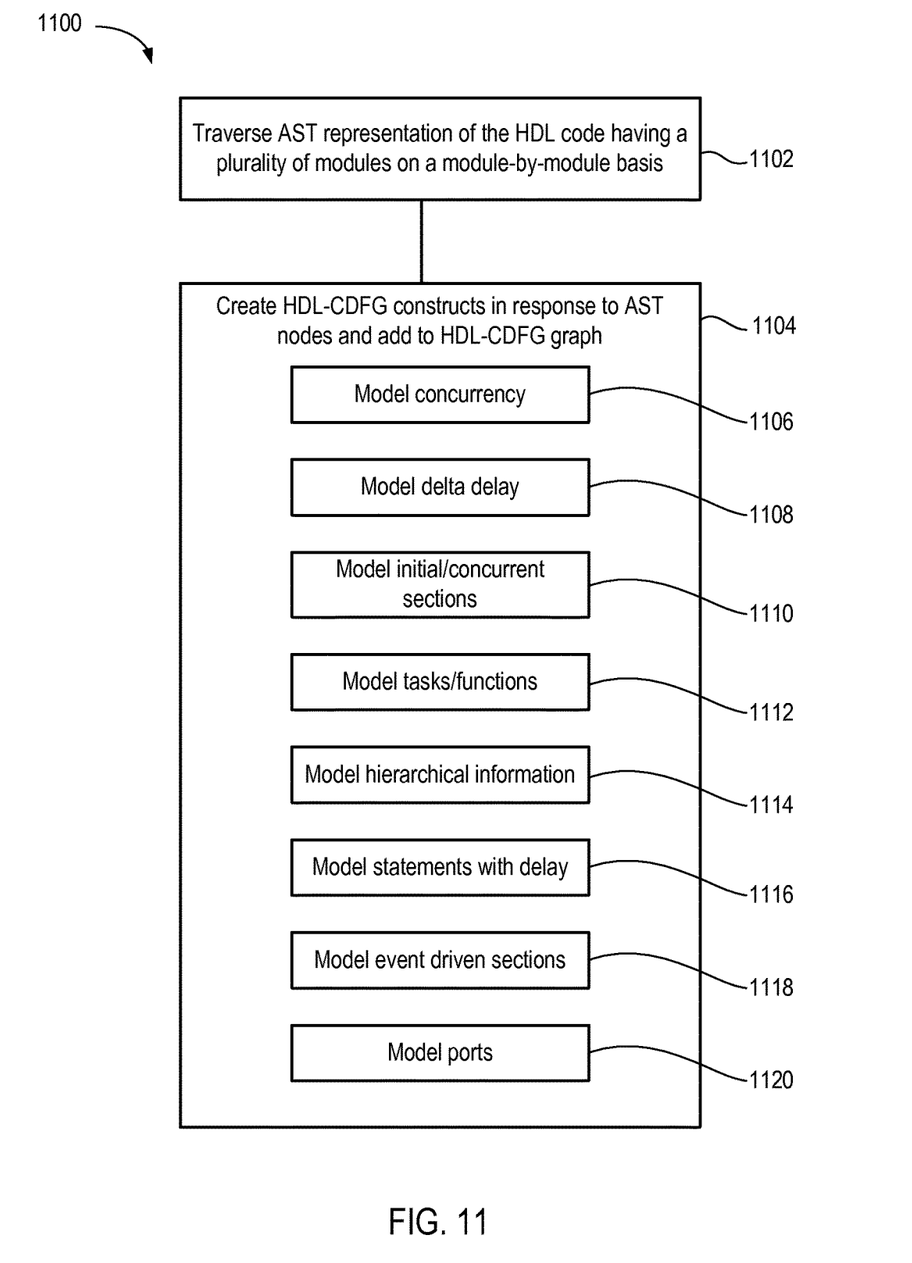
FIG. 11 is a flow diagram depicting an example of a method of generating a control and data flow graph for hardware HDL code specifying a circuit design.

FIG. 11 is a flow diagram depicting an example of a method 1100 of generating a control and data flow graph for hardware HDL code specifying a circuit design. The method 1100 can be performed by the HDL-CDFG generator 207. At step 1102, the HDL-CDFG generator 207 traverses the AST representation of the HDL code having a plurality of modules on a module-by-module basis. At step 1104, the HDL-CDFG generator 207 creates HDL-CDFG constructs in response to AST nodes and adds the HDL-CDFG constructs to the control and data flow graph. Various HDL-CDFG constructions can be generated as described above. For example, at step 1106, the HDL-CDFG generator 207 can model concurrency, as described above with respect to FIG. 5. At step 1108, the HDL-CDFG generator 207 can model delta delay, as described above with respect to FIG. 6. At step 1110, the HDL-CDFG generator 207 can model initial/concurrent sections, as described above with respect to FIG. 7. At step 1112, the HDL-CDFG generator 207 can model tasks and functions, as described above with respect to FIGS. 8 and 9. At step 1114, the HDL-CDFG generator 207 can model hierarchical information, as described above. At step 1116, the HDL-CDFG generator 207 can model event driven sections, as described above with respect to FIG. 10. At step 1118, the HDL-CDFG generator 207 can model ports defined in the HDL code, as described above.

In an example, the HDL-CDFG generator 207 can generate the HDL-CDFG 224 from a single walk of the AST 222. Starting from identified top-level modules, the HDL-CDFG generator 207 creates HDL-CDFG constructs described herein as appropriate when encountering different types of AST nodes. When encountering a module/architecture definition, the HDL-CDFG generator 207 creates a new execution unit and finalizes the creation of any previous execution unit. If the HDL-CDFG generator 207 encounters a function or task definition, the HDL-CDFG generator 207 does not finalize the previous execution unit, as the HDL-CDFG generator 207 will return to the previous execution unit after processing the function/task.

As the AST is traversed, the HDL-CDFG generator 207 identifies whether a concurrent path or an initial path is being processed. For each concurrent path that is encountered, the HDL-CDFG generator 207 creates a new path and ties the new path to the loopback source. If the HDL-CDFG generator 207 was previously processing a concurrent path, the HDL-CDFG generator 207 first ties the last basic block encountered to the loopback sink. For each initialization block, the HDL-CDFG generator 207 creates a new initial path tied to a true source. If the HDL-CDFG generator 207 was previously processing a different initialization path, the HDL-CDFG generator 207 first ties the last basic block encountered to the loopback source.

When the HDL-CDFG generator 207 encounters a delay or event during the traversal, the HDL-CDFG generator 207 splits the graph at that location. The HDL-CDFG generator 207 ties the last basic block encountered to the appropriate section depending on if a concurrent path or initial path was being processed, and then creates a new concurrent path. Subsequent code belongs to this new concurrent path even if the original HDL is contained within an initial section. If the delay or event occurs within a function or task, there is no concurrent section, but the graph still must be split and a delay block must be inserted, as described above in FIG. 9.

When a loop is encountered, the basic blocks before, comparison, increment, and after sections are created. The loop body, however, might contain a delay or event, which would cause a split in the graph. If the loop was in an initial section and contained a delay, the comparison, increment, and after basic blocks are placed in the concurrent section of the graph as the control jumps back to the start after a delay has been hit.

Figure 12:
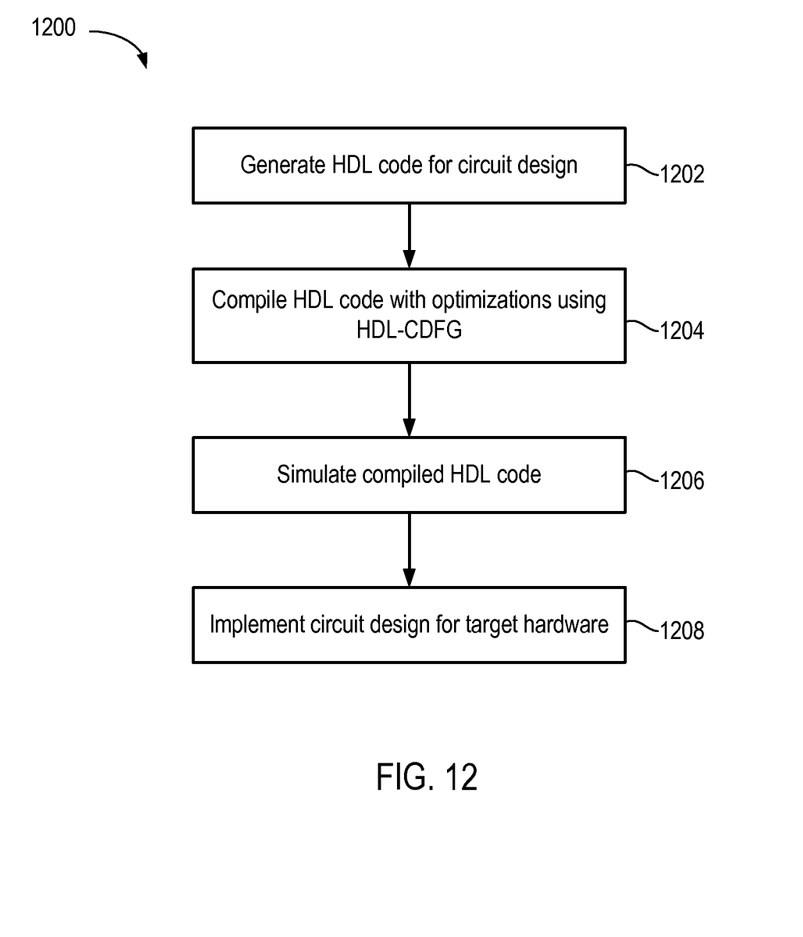
FIG. 12 is a flow diagram depicting an example of a method of circuit design and simulation.

FIG. 12 is a flow diagram depicting an example of a method 1200 of circuit design and simulation. The method 1200 can be performed by the circuit design system 100. The method 1200 begins at step 1202, where a user interacts with the circuit design system 100 to generate HDL code for a circuit design. At step 1204, the circuit design system compiles the HDL code with optimizations using the HDL-CDFG generated from the HDL code. At step 1206, the circuit design system 100 simulates the compiled HDL code. At step 1208, the circuit design system 100 implements the circuit design for target hardware. As described above, the HDL-CDFG enables compiler optimizations to be performed for the underlying concurrent HDL language. The optimized compiled HDL allows for more efficient simulation in terms of simulation time and consumed computing resources (e.g., memory, processor, etc.). Thus, generation of the HDL-CDFG as described above improves the functioning of the circuit design system 100, in particular, the computer 101. Furthermore, generation of the HDL-CDFG enables proper simulation of the HDL code before the circuit design is implemented in order to ensure proper operation of the circuit design. This allows a user to "debug" a circuit design before actually implementing the circuit design in target hardware. Thus, generation of the HDL-CDFG improves the physical implementation of the circuit design.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific examples, other and further examples may be devised without departing from the basic scope thereof, and the scope thereof is determined by the claims that follow.

What is claimed is:

1. A method of generating a control and data flow graph for hardware description language (HDL) code specifying a circuit design, comprising:
    traversing an abstract syntax tree (AST) representation of the HDL code having a plurality of modules on a module-by-module basis; and
    using a processor, generating the control and data flow graph by adding an execution unit to the control and data flow graph for each module having concurrent paths, each execution unit comprising nodes in the control and data flow graph, the nodes including a loopback sink that merges the concurrent paths and a loopback source that receives feedback from the loopback sink and propagates the feedback to the concurrent paths.

2. The method of claim 1, wherein the HDL code includes variables, and the method further comprises:
    tracking, in the control and data flow graph, a new version and an old version of each of the variables in the HDL code that is assigned using a non-blocking assignment.

3. The method of claim 1, wherein the step of generating comprises adding a first execution unit to the control and data flow graph for a first module having an initialization section, wherein the nodes of the first execution unit include a true source that feeds at least one initial path to the respective loopback source and a true sink that receives the feedback from the respective loopback sink.

4. The method of claim 1, wherein the step of generating comprises:
    adding another execution unit to the control and data flow graph for a function in the HDL code, the other execution unit for the function comprising nodes in the control and data flow graph including a true source the feeds an initial path and a true sink that receives from the initial path.

5. The method of claim 1, wherein the step of generating comprises:
    adding another execution unit to the control and data flow graph for a task in the HDL code having a delay point, the other execution unit for the task comprising nodes in the control and data flow graph including a true source that feeds an initial path, a delay block that splits the initial path, and a true sink that receives from the initial path.

6. The method of claim 1, wherein the step of generating comprises adding a first execution unit to the control and data flow graph for a first module, where the concurrent paths are guarded with an event, the nodes of the first execution unit include a node representing a path where the event did not occur.

7. The method of claim 1, wherein the HDL code includes ports defined therein, and wherein the method further comprises:
    adding instructions to the control and data flow graph for the ports defined in the HDL code.

8. A system, comprising:
    a memory for storing program code and an abstract syntax tree (AST) representation of hardware description language (HDL) code having a plurality of modules;
    a processor, coupled to the memory, configured to execute the program code to:
        traverse the AST on a module-by-module basis; and generate the control and data flow graph by adding an execution unit to the control and data flow graph for each module having concurrent paths, each execution unit comprising nodes in the control and data flow graph, the nodes including a loopback sink that merges the concurrent paths and a loopback source that receives feedback from the loopback sink and propagates the feedback to the concurrent paths.

9. The system of claim 8, wherein the HDL code includes variables, and wherein the processor is configured to:
track, in the control and data flow graph, a new version and an old version of each of the variables in the HDL code that is assigned using a non-blocking assignment.

10. The system of claim 8, wherein the processor is configured to add a first execution unit to the control and data flow graph for a first module having an initialization section, wherein the nodes of the first execution unit include a true source that feeds at least one initial path to the respective loopback source and a true sink that receives the feedback from the respective loopback sink.

11. The system of claim 8, wherein the processor is further configured to:
add another execution unit to the control and data flow graph for a function in the HDL code, the other execution unit for the function comprising nodes in the control and data flow graph including a true source the feeds an initial path and a true sink that receives from the initial path.

12. The system of claim 8, wherein the processor is further configured to:
add another execution unit to the control and data flow graph for a task in the HDL code having a delay point, the other execution unit for the task comprising nodes in the control and data flow graph including a true source that feeds an initial path, a delay block that splits the initial path, and a true sink that receives from the initial path.

13. The system of claim 8, wherein the processor is configured to add a first execution unit to the control and data flow graph for a first module, where the concurrent paths are guarded with an event, the nodes of the first execution unit include a node representing a path where the event did not occur.

14. The system of claim 8, wherein the HDL code includes ports defined therein, and wherein the processor is further configured to:
add instructions to the control and data flow graph for the ports defined in the HDL code.

15. A non-transitory computer readable medium having instructions stored thereon that when executed by a processor cause the processor to perform a method of generating a control and data flow graph for hardware description language (HDL) code specifying a circuit design, comprising:
traversing an abstract syntax tree (AST) representation of the HDL code having a plurality of modules on a module-by-module basis; and
generating the control and data flow graph by adding an execution unit to the control and data flow graph for each module having concurrent paths, each execution unit comprising nodes in the control and data flow graph, the nodes including a loopback sink that merges the concurrent paths and a loopback source that receives feedback from the loopback sink and propagates the feedback to the concurrent paths.

16. The non-transitory computer readable medium of claim 15, wherein the HDL code includes variables, and wherein the method further comprises:
tracking, in the control and data flow graph, a new version and an old version of each of the variables in the HDL code that is assigned using a non-blocking assignment.

17. The non-transitory computer readable medium of claim 15, wherein the step of generating comprises adding a first execution unit added to the control and data flow graph for a first module having an initialization section, wherein the nodes of the first execution unit include a true source that feeds at least one initial path to the respective loopback source and a true sink that receives the feedback from the respective loopback sink.

18. The non-transitory computer readable medium of claim 15, wherein the step of generating comprises:
adding another execution unit to the control and data flow graph for a function in the HDL code, the other execution unit for the function comprising nodes in the control and data flow graph including a true source the feeds an initial path and a true sink that receives from the initial path.

19. The non-transitory computer readable medium of claim 15, wherein the step of generating comprises:
adding another execution unit to the control and data flow graph for a task in the HDL code having a delay point, the other execution unit for the task comprising nodes in the control and data flow graph including a true source that feeds an initial path, a delay block that splits the initial path, and a true sink that receives from the initial path.

20. The non-transitory computer readable medium of claim 15, wherein the step of generating comprises adding a first execution unit added to the control and data flow graph for a first module, where the concurrent paths are guarded with an event, the nodes of the first execution unit include a node representing a path where the event did not occur.

* * * * *